United States Patent [19]
Tuma

[11] 3,987,414
[45] Oct. 19, 1976

[54] DIGITAL REMOTE CONTROL FOR ELECTRONIC SIGNAL RECEIVERS

[75] Inventor: Alois Vaclav Tuma, Schlieren, Switzerland

[73] Assignee: RCA Corporation, New York, N.Y.

[22] Filed: Mar. 3, 1975

[21] Appl. No.: 554,561

[30] Foreign Application Priority Data
Mar. 29, 1974 United Kingdom............... 14032/74

[52] U.S. Cl.................. 340/167 R; 340/171 R; 343/228
[51] Int. Cl.²........................................... H04B 1/06
[58] Field of Search............... 340/171 R, 146.1 BA, 340/146.1 C; 343/228; 178/DIG. 15; 325/55

[56] References Cited
UNITED STATES PATENTS

| | | |
|---|---|---|
| 3,344,353 | 9/1967 | Wilcox......................... 340/146.1 C |
| 3,384,873 | 5/1968 | Sharma................................. 325/55 |
| 3,678,392 | 7/1972 | Houghton..................... 178/DIG. 15 |

Primary Examiner—Harold I. Pitts
Attorney, Agent, or Firm—Eugene M. Whitacre; Kenneth R. Schaefer

[57] ABSTRACT

A digital remote control system provides substantially simultaneous actuation of remote functions. Repetitive transmissions of a plurality of remote control instructions and an identifier pattern are compared in an associated remote control receiver to verify authenticity of received signals. Transmitted signals are digitally encoded to contain both message information and encoded clock signals.

11 Claims, 5 Drawing Figures

DIGITAL REMOTE CONTROL FOR ELECTRONIC SIGNAL RECEIVERS

BACKGROUND OF THE INVENTION

This invention is concerned with remote control adjustment of electronic signal receivers and more particularly to a system for providing substantially simultaneous remote actuation of a plurality of control functions in a color television receiver.

Remote control tuning of television receivers has, in the past, been accomplished in many different ways. In one type of known system, a remote control transmitter is utilized to transmit a different ultrasonic frequency signal for actuation of each selected remote control function. Thus, where eight functions are to be controlled (e.g., volume up and down, color up and down, tint plus or minus, channel up and down), eight different frequencies in the vicinity, for example, of 30 to 40 KHz are transmitted and received in the ultrasonic remote control system. The use of a plurality of ultrasonic frequencies requires that the remote control receiver have a relatively large bandwidth. A receiver with a relatively large bandwidth is generally more susceptible to extraneous noise signals than one with a narrower bandwidth. Further, receiving and transmitting transducers having relatively broad bandwidth generally have a lower sensitivity than their narrow bandwidth counterparts, thus requiring the transmitter to expand a relatively large amount of energy to effect reliable signal reception.

SUMMARY OF THE INVENTION

In accordance with one aspect of the present invention, a plurality of functions (e.g., eight) are controlled utilizing only two frequencies. The control signal for each separate function is identified according to its position in a sequence of control signals which are accompanied by an identification code.

Furthermore, remote control actuators on the typical remote control transmitter are comprised of two-position (on-off) push-button switches. These switches are generally quite distinct from their associated counterparts on the television receiver. Accordingly, manipulation of the respective controls on the television receiver and on the remote control transmitter for achieving the same results are generally quite different. To simplify operation of the television remote control system, a remote control transmitter is provided having controls that may be manipulated in the same manner as their respective counterparts on the television receiver.

Prior remote control systems have typically been susceptible to erroneous signals caused by multipath reception. Multipath reception is generally caused by reflections of the transmitted signal from different objects in the vicinity of the receiver.

Other problems which have been encountered in prior systems include false triggering of the receiver control circuits by signals generated from such items as jingling keys, the bell in a telephone and harmonic oscillations of the television receiver's horizontal sweep generator.

A system according to the present invention which utilizes a relatively narrow transmitting and receiving bandwidth and further is relatively unaffected by extraneous noise signals incorporates a transmitter having an encoded digital signal representative of a plurality of desired control functions. A pattern generator produces a fixed pattern which precedes the transmitted code signal. A frequency shift oscillator is utilized to broadcast the ones and zeros of the encoded transmission signal in two representative frequencies. A receiver receptive to signals broadcast by the transmitter incorporates decoding means for converting the frequency modulated signal to a digital (i.e., binary) signal. Shift register means are utilized for storing digital signals broadcast by the remote transmitter. A comparator is utilized to compare previous transmissions with the current transmission to verify authenticity of the transmitted signal. Data register means responsive to the signals from the comparator are utilized to store a verified signal. Upon verification of a valid signal, the received information is coupled to the appropriate control circuits.

In a further aspect of the present invention, a remote control transmitter incorporates means for serially encoding at least one binary remote control instruction. A further means rearranges this serial code into a format including both binary instructions and encoded clock signals. Decoding means in a remote control receiver decodes both the binary instructions and the encoded clock signals. Control means responsive to the binary instructions actuates the remote control functions.

BRIEF DESCRIPTION OF THE DRAWINGS

A better understanding of this invention may be derived with reference to the following specification and the drawings of which.

DESCRIPTION OF THE PREFERRED EMBODIMENT

Figure 1:
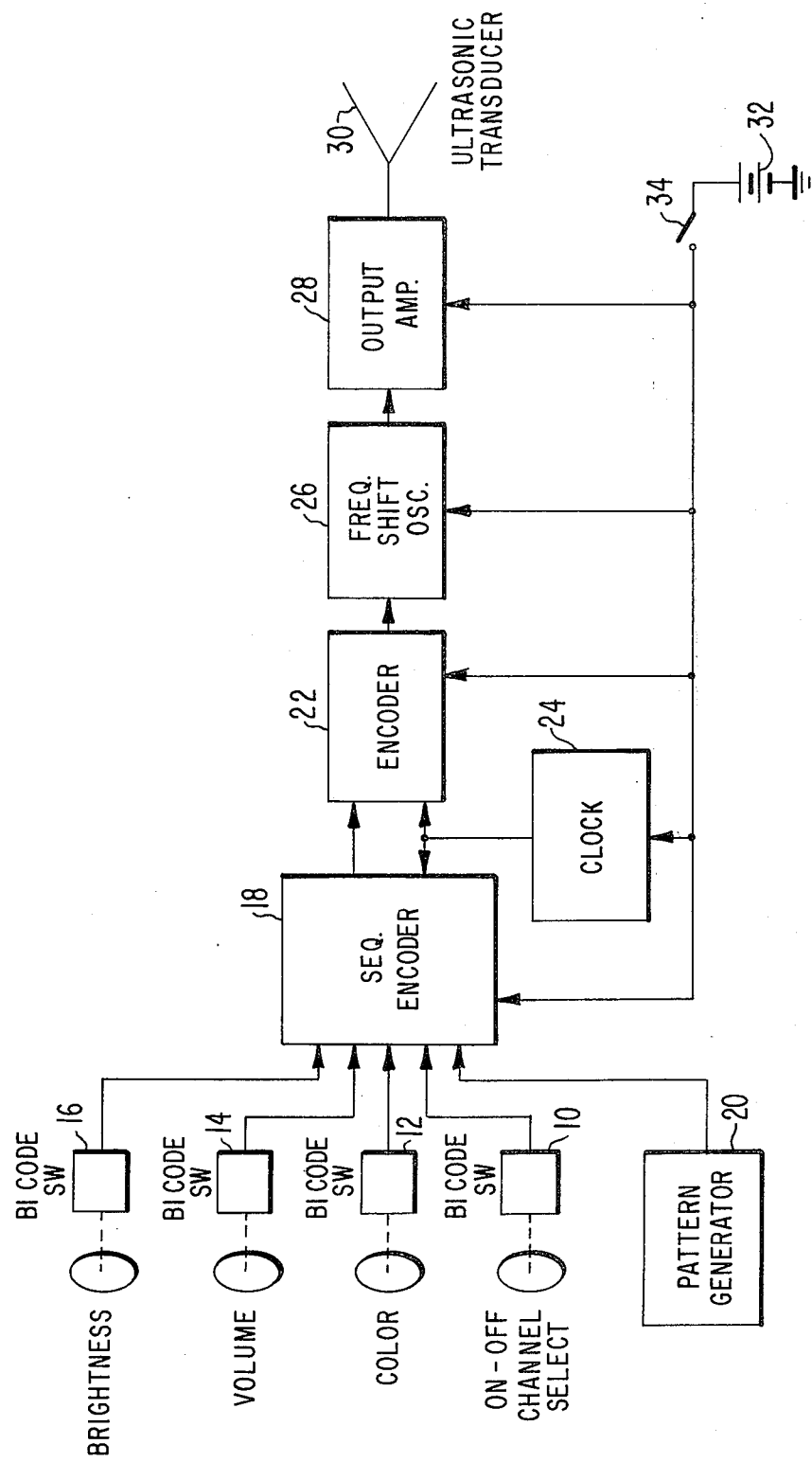
FIG. 1 is a block diagram of a remote control transmitter in accordance with the present invention.

With reference to FIG. 1, a series of, for example, four operator controlled binary code switches 10, 12, 14 and 16 is coupled to a sequential encoder 18. A pattern generator 20 is further coupled to the sequential encoder 18. Signals provided by sequential encoder 18 are coupled to a combined clock and data encoder 22. Signals produced at the output of encoder 22 are coupled to a frequency shift oscillator 26, the output of which is coupled to an output amplifier 28. A clock signal generator 24 is coupled to encoders 18 and 22 for providing digital timing signals. A transducer 30 is coupled to the output of amplifier 28 for transmitting desired messages. A source of supply voltage 32 is coupled through a switch 34 to the respective electrical circuits within the transmitter.

In the operation of the above-described apparatus, binary code switches 10, 12, 14 and 16 are adjusted to select a desired channel and operating levels of, for example, color, volume and brightness. Switches 10 through 16 each produce a binary coded output signal on a respective group of four lines (each group being shown as one line). The binary output codes of the respective switches may be changed by adjusting an appropriately connected rotary knob, thumb wheel or sliding member. The type of actuating control (knob, wheel, etc.) on each switch may be selected in accordance with the appropriate counterpart utilized on the television receiver to provide a direct correlation for the viewer between local and remote adjustment of the receiver controls.

Upon adjustment (e.g., rotation) of each of the binary code switches, a binary output signal, for example, representing one of the states 0 through 15, is produced at each switch. The combination of logical ones and zeros produced on the four output lines of ech switch may be generated by having contacts associated with each switch for grounding those lines on which a logical zero is desired and coupling the non-grounded lines to a source of supply voltage having a level representative of a logical "one". Binary signals produced by switches 10, 12, 14 and 16 are ultimately to be utilized to control amplitude levels and channel selection of the remotely operated television receiver. Although switches 10–16 are illustrated as being used to control channel number, color, volume and brightness, other control functions may be substituted or added.

An on-off power control function is derived from the selection switch 10 by utilizing a particular switch output code, for example, four binary zeros to represent the power-off condition. Selection of a channel number other than zero causes the transmitter to broadcast an "on" command together with the selected channel number. Although switches 10–16 are described as having four bits of information and accordingly four output lines, a larger or smaller number of output lines and, therefore, bits of information may also be utilized.

Pattern generator 20 is utilized to produce a preselected binary code pattern which is thereafter used as an identifier code at the end (or beginning) of each transmitted message. This preselected code may consist of a combination of ones and zeros which are distinct from any of the codes produced by the binary code switches 10–16. Illustratively, pattern generator 20 may produce twelve bits of information in the form of two six-bit series, each of five logical ones followed by a logical zero. This pattern may be produced by a generator (20) comprised of twelve output lines having the sixth and twelfth lines coupled to ground (logical zero) and the remaining ten lines coupled to a source of voltage. The level of this latter source of voltage is representative of a logical one.

Sequential encoder 18 is receptive to signals from clock 24 (see FIG. 3a) and also to codes produced by switches 16–10 and pattern generator 20. Encoder 18 may be comprised of one or more parallel to serial shift registers having a total of at least 32 parallel input lines and stages. The sixteen output lines of switches 16–10 (four lines from each switch) and twelve output lines from generator 20 are respectively coupled to 28 of the 32 register input lines. Illustratively, switch 16 is coupled to input lines 1–4, switch 14 to input lines 6–9, switch 12 to input lines 11–14, switch 10 to input lines 16–19 and generator 20 to input lines 21–32. By applying an appropriate signal to a parallel/serial input line (not shown) of encoder 18, signal information on the 32 parallel input lines are entered into the associated shift register stages. Clock signals from clock 24 cause signal information within the respective shift register stages to sequentially appear at an associated serial output terminal in the order in which they are respectively positioned (least significant bit first). In other words, the data in register stage 1 appears at the associated serial output terminal first, while the data in stage 32 appears last. The 32 bit serial code may be repeated at the serial output terminal by re-entering the data on the 32 input lines into the associated register stages and applying clock signals. A typical sequentially encoded signal as provided at the output of encoder 18 is illustrated in FIG. 3b.

Figure 3:
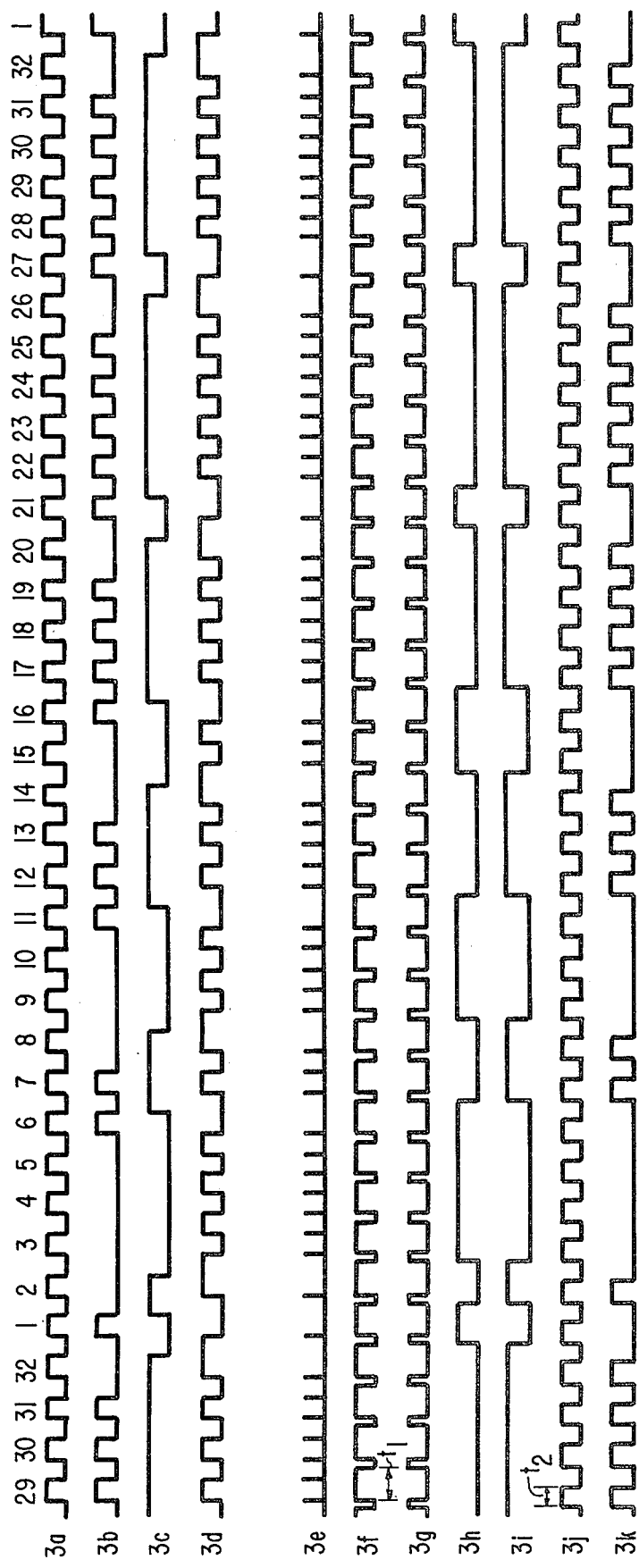
FIGS. 3a–3k are representations of waveforms associated with the apparatus of FIGS. 1, 2, 4 and 5.

With reference to FIG. 3b, a combination of four, four-bit information commands (clock intervals –20) and a twelve-bit identifier pattern (clock intervals 21–32) are generated during the clock intervals of 1–32. The information commands produced by switches 16–10 are respectively illustrated in FIG. 3b as a binary count of 0001 (decimal 1) beginning at clock interval 1, a binary count of 0011 (decimal 3) beginning at clock interval 6, a binary count of 0111 (decimal 7) beginning at clock interval 11 and a binary count of 1111 (decimal 15) beginning at clock interval 16. An identifier pattern beginning at clock interval 21 follows the information commands (message) and terminates at clock interval 32. An encoder 22 receives the signals provided by the sequential encoder 18 and changes the format of these signals to a form in which both the sequential data signals and the signals from clock 24 may be decoded. A detailed schematic of encoder 22 is illustrated in FIG. 4.

Figure 4:
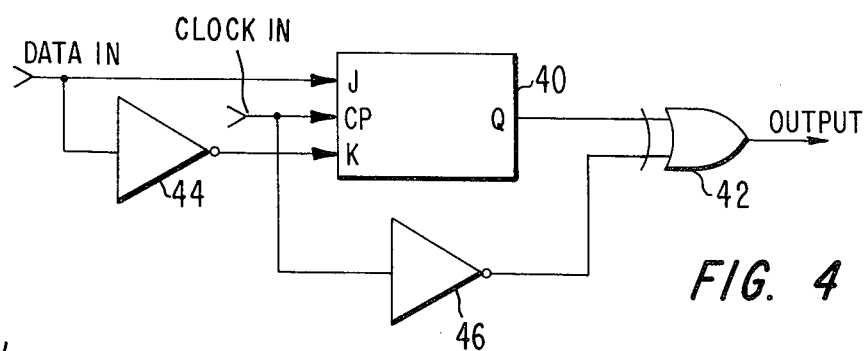
FIG. 4 is a schematic diagram of an encoder circuit as utilized with the apparatus of FIG. 1.

With reference to FIG. 4, a JK flip-flop 40 receives data input signals through an inverter 44 to a K input and direct coupled to a J input. An exclusive OR gate 42 has an input coupled to the Q output of flip-flop 40 and further receives inverted clock signals from an inverter 46. Application of data signals such as those illustrated in FIG. 3b to the data-in terminal and application of the clock signals of FIG. 3a to the clock-in terminal of this apparatus cause flip-flop 40 to produce the waveform of FIG. 3c at the associated Q output terminal. An encoded output signal, as illustrated in FIG. 3d, is thereafter produced by applying output signals from flip-flop 40 and inverted clock signals from inverter 46 to inputs on exclusive OR gate 42. Modification of the data signals to the form shown in FIG. 3d is desirable in order to facilitate reproduction of the transmitter clock signals in the remote control receiver. A detailed explanation of how the clock signals are recovered from the transmitted signal information is given later with reference to FIG. 5.

Encoded signals provided at the output of encoder 22 are coupled to frequency shift oscillator 26. Oscillator 26 provides one of two output frequencies in response to application of a logical one or zero at the input terminal. Illustratively, oscillator 26 may provide an output frequency of 37 KHz in response to application of a logical one and 36 KHz in response to application of a logical zero. An output amplifier 28 receives the signals provided by oscillator 26 and provides these signals at a relatively high amplitude to an ultrasonic transducer 30. Transducer 30 may incorporate a piezoelectric element and have a relatively narrow bandwidth and high gain.

Signal transmission from the apparatus of FIG. 1 is initiated by presetting switches 10–16 to desired positions and depressing transmit switch 34. When switch 34 is closed, current from battery 32 is coupled to the electrical circuits of the remote control transmitter effecting signal transmission. Once switch 34 is closed, a continuous repetition of message and pattern is transmitted. Subsequent readjustment of switches 10–16 may be made while switch 32 is closed allowing the operator to manipulate the remote control adjustments in substantially the same manner in which the respective counterparts are adjusted at the television receiver.

Figure 2:
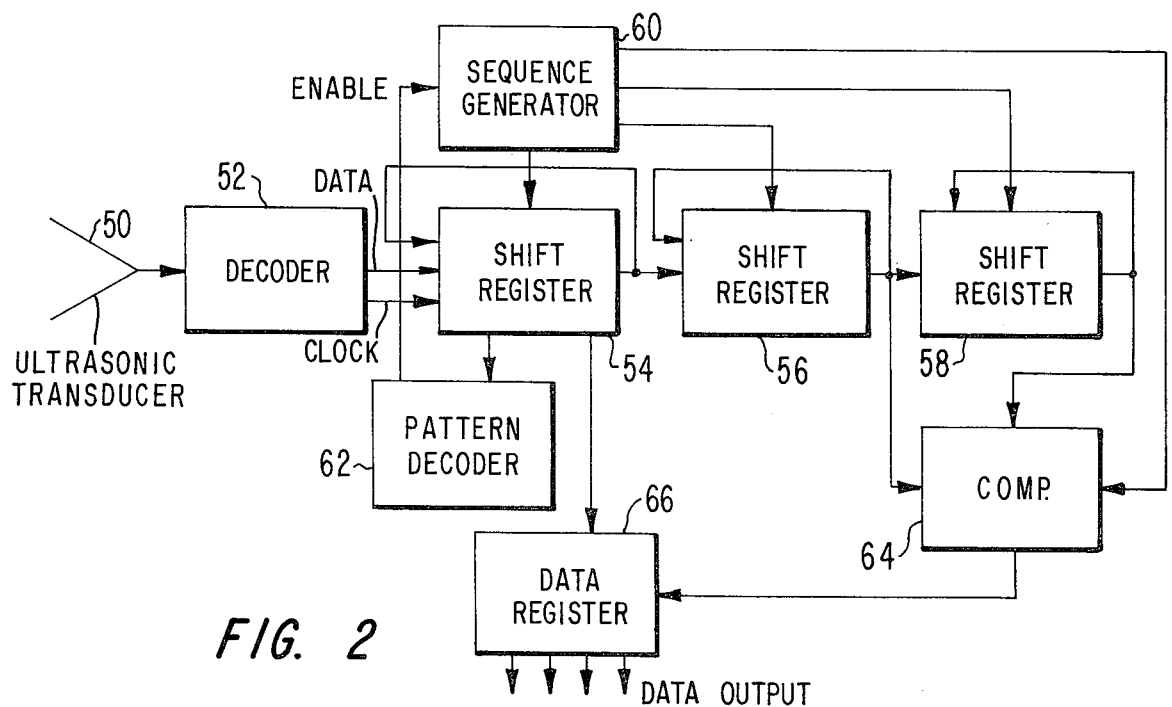
FIG. 2 is a block diagram of a remote control receiver in accordance with the present invention.

A remote control receiver suitable for receiving and decoding the signals provided by the transmitter of FIG. 1 is illustrated in FIG. 2. With reference to FIG. 2, an ultrasonic receiving transducer 50 is coupled to a signal decoder 52 which serves to separate the received combined clock and data signals. Clock and data signals provided by decoder 52 are coupled to a first shift register 54. A second shift register 56 receives signals from the first shift register and couples these signals to a third shift register 58. A sequencing generator 60 provides clock signals to the first, second and third shift registers in response to an enabling signal from a pattern decoder 62. A comparator 64 serially compares signals provided at the outputs of registers 56 and 58 and couples a comparison signal to a data register 66. Data register 66 receives input signals from shift register 54.

In the operation of the above-described system, signals provided by the transmitter of FIG. 1 are received by receiving transducer 50. Transducer 50 may be a piezoelectric type having similar characteristics to the one utilized with the transmitter apparatus of FIG. 1. Signals received by transducer 50 are coupled to decoder 52. Decoder 52 includes frequency detecting apparatus which comprise, for example, a phase-locked loop suitable for phase locking to the transmitted signals and providing bilevel output signals in response to the two different transmitted frequencies. Decoder 52 may further include circuitry for converting the code produced, for example, at the output of encoder 22 of FIG. 1 (see FIG. 3d) to the coded sequence provided at the output of sequential encoder 18 (see FIG. 3b). A decoder circuit suitable for use in decoder 52 is illustrated in schematic form in FIG. 5.

Figure 5:
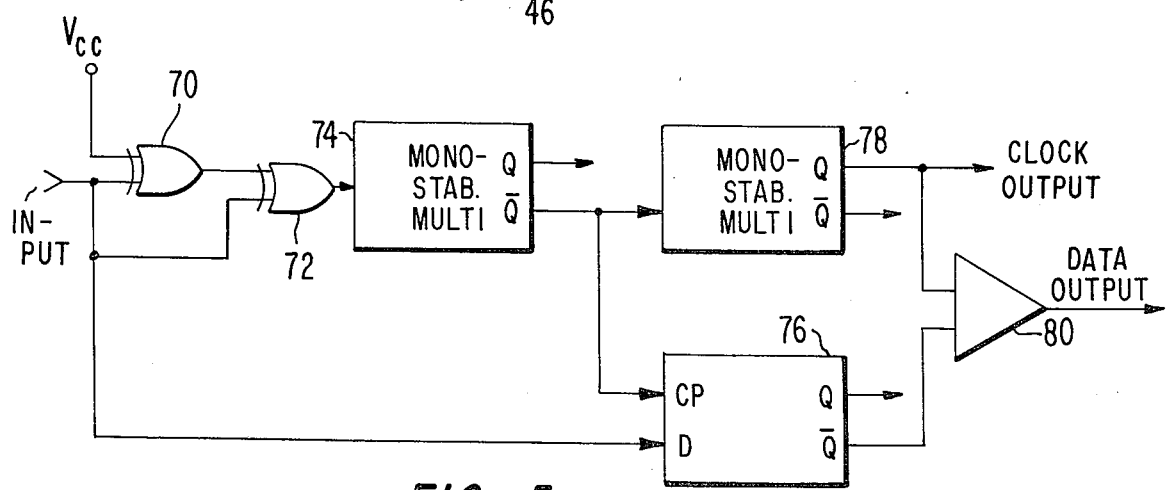
FIG. 5 is a schematic diagram of a decoder as utilized with the apparatus of FIG. 2.

The apparatus in FIG. 5 includes a pulse forming circuit comprised of exclusive OR gates 70 and 72. Pulses provided at the output of OR gate 72 are coupled to a monostable multivibrator 74. Signals provided at the output of multivibrator 74 are coupled to a clock input of a D flip-flop 76 and to a second monostable multivibrator 78. Flip-flop 76 further receives data input signals directly at a D input terminal. An AND gate 80 combines signals from flip-flop 76 and mutivibrator 78 to produce a desired output signal. The operation of the circuitry in FIG. 5 can best be shown by way of example. Illustratively, the signal of FIG. 3d is received by the apparatus of FIG. 2 and applied to the inputs of a pulse forming circuit comprised of exclusive OR gates 70 and 72. A pulse train, as shown in FIG. 3e is produced at the output of gate 72 and this pulse train is utilized to trigger monostable multivibrator 74. Multivibrator 74 has a time constant of $t_1$ that is adjusted to be greater than one-half and less than one clock interval of the clock in the remote control transmitter (see FIG. 3a). Signals provided at the Q and $\overline{Q}$ outputs of multivibrator 74 are respectively illustrated in FIGS. 3f and 3g. Inverted signals provided at the $\overline{Q}$ terminal of multivibrator 74 clock the input data to D type flip-flop 76. With the data signals of FIG. 3d applied to the D input and the signals of FIG. 3g applied at the clock input (CP), flip-flop 76 respectively produces the waveforms of FIGS. 3h and 3i at the associated Q and $\overline{Q}$ output terminals.

To facilitate signal decoding, the clock waveform of FIG. 3a is reproduced in the decoder by supplying one output (FIG. 3g, $\overline{Q}$) of multivibrator 74 to multivibrator 78. Monostable multivibrator 78 is adjusted to provide a pulse output having a duration $t_2$ equal to approximately one-half the period of the clock signals illustrated in FIG. 3a. The output signals of multivibrator 78 are shown in FIG. 3j. It will be appreciated that the waveforms shown in FIG. 3j are substantially the same as the clock waveforms illustrated in FIG. 3a. In order to recover the signal information transmitted by the remote control transmitter, the inverted output signals of flip-flop 76 are combined with the regenerated clock signals from multivibrator 78 in an AND gate 80. The output signals from gate 80 (illustrated in FIG. 3k) are the same signals as those produced by the sequential encoder 18 of FIG. 1.

Although an AND gate (80) is illustrated as the combining means of signals from multivibrator 78 and flip-flop 76, combination of these respective signals may be accomplished by, for example, clocking (with multivibrator 78) the $\overline{Q}$ signal of flip-flop 76 directly into an appropriate shift register (e.g., register 54).

Data signals provided by decoder 52 (see FIG. 3k) are clocked into register 54 (see FIG. 2) by the clock signal illustrated in FIG. 3j. When the last 12 bits of signal information shifted into register 54 correspond to a predetermined code, (see pattern of FIG. 3b, bits 21–32) pattern decoder 62, which is arranged specifically to sense this code, becomes energized enabling sequence generator 60. Sequence generator 60 remains enabled for a one-half clock pulse interval of the transmitted clock signal (see $t_2$ of FIG. 3j) and provides, during this interval, both mode and high frequency clock signals to shift registers 54–58 and comparator 64. The high frequency clock signals produced by generator 60 during the $t_2$ interval are provided in four uninterrupted sub-sequences of 32 pulses each. A 128 pulse sequence is utilized for providing the necessary amount of steps to compare the received signal (message and pattern) with a previously received signal and decide whether or not to enter this signal in an associated output register. In the first sub-sequence (the first 32 pulse interval), generator 60 provides both high frequency clock signals and mode signals to registers 54–58 and only mode signals to comparator 64. Mode signals applied to each register control the coupling of the respective input terminals to either an output terminal of the same register or the preceeding stage. When a register input and a register output terminal are coupled together, signal information shifted to the output terminal of this register is reapplied to the input of the register causing the stored signal information to recirculate. Mode signals are applied to comparator 64 to inhibit operation of this comparator except during the second sub-sequence.

Clock and mode signals applied in the first sub-sequence to the respective registers cause register 54 to recirculate the signal information stored within; register 56 to receive information provided at the output terminal of register 54; and register 58 to recirculate the information within. At the end of the first sub-sequence, registers 54 and 56 contain the same signal information. Register 58 contains the same signal information as it contained just prior to the first sub-sequence. In the second sub-sequence interval, data in shift register 54 is again recirculated, data in shift register 56 is recirculated and data in shift register 58 is recirculated. Concurrently with the recirculation of data in registers 56 and 58, an appropriate mode signal is applied to comparator 64. Comparator 64 provides a bit by bit comparison of each of the bits of data in registers 56 and 58 including the pattern portion of the signal information. If the data in registers 56 and 58 are identical, a preselect circuit in comparator 64 is set in a first condition.

In the third sub-sequence, data in respective shift registers 54 and 56 are recirculated. Concurrently, the data in register 56 is transferred to shift register 58. At the end of the third sub-sequence, registers 54–58 contain the same data contents. The transfer of data from register 56 to register 58 is in preparation for comparison of a subsequent message and pattern to be received by this apparatus. After sequence generator 60 reaches a count of 96 (the beginning of the fourth sub-sequence), an enable signal from this generator is provided to comparator 64. If the preselect circuitry in comparator 64 is set in a first condition, the enable signal causes comparator 64 to provide a latch signal to register 66. This latch signal remains on for the entire fourth sub-sequence (last 32 bits) allowing signal information in shift register 54 to be transferred in parallel to register 66. If, however, the preselect condition in comparator 64 is in a second condition indicating that the data in registers 56 and 58 are not the same, then no data is transferred to register 66 and the original data therein remains unchanged. Signal information in register 66 represents data which has been verified as being identical to a previous data transmission. Data in register 66 corresponds in sequence to the 16 bits of information (four groups of four bits) transmitted by the apparatus of FIG. 1. The 16 bits of information correspond respectively to the binary data representative of channel number, color, volume and brightness. Control circuitry (not shown) is coupled to the 16 data output lines (shown as four) of register 66 and responsively provides, in accordance with the numerical value of each four bit binary group, a desired amount of control over television receiver channel selection, color, volume and brightness.

Although this remote control system has been described as controlling four specific television functions, it will be appreciated that control of other remote functions may similarly be realized. It will further be appreciated by one skilled in the art that the number of remote control functions may be increased or decreased as can the number of bits used to control each function without changing the basic operation of the apparatus.

What is claimed is:

1. A remote control system for an electronic television signal receiver for providing substantially simultaneous, continuous remote control of a plurality of control functions in said receiver comprising:
    means for generating at least first and second binary coded signals having numerical values corresponding to desired conditions of a corresponding number of control functions;
    a pattern generator for producing a predetermined plural bit binary coded identification signal;
    encoding means for combining in time sequence said binary coded identification signal and said first and second binary coded control function signals and for providing repetitive sequences thereof, each of said control function signals being identified by and associated with a respective predetermined time interval relative to said identification signal;
    frequency generating means for providing signals at first and second frequencies in response to respective binary states represented by said binary signals provided by said encoding means; and
    a signal transmitting transducer responsive to said signals provided by said frequency generating means for providing repetitive ultrasonic frequency output signals representative of desired conditions of each of said control functions in said receiver.

2. Apparatus according to claim 1 wherein said generating means comprises first and second binary code switches, each having at least two output lines for providing binary code signals relative to a selected condition.

3. Apparatus according to claim 2 wherein said encoding means includes:
    a parallel to serial shift register having a plurality of inputs receptive to binary code signals; and
    a clock signal generator coupled to said shift register for effecting serial data output from said register.

4. Apparatus according to claim 3 wherein said pattern generator is comprised of a plurality of wired logical ones and zeros arranged in a sequence distinct from code sequences provided by said generating means.

5. Apparatus according to claim 4 wherein said encoding means includes apparatus for rearranging the binary signals provided by said parallel to serial shift register comprising:
    a bistable multivibrator receptive to said clock and message signals;
    an inverter for inverting said clock signals; and
    an exclusive OR gate coupled to said multivibrator and said inverter for providing encoded message signals.

6. Apparatus according to claim 3 including a frequency shift oscillator for respectively providing output signals at first and second frequencies in response to logical ones and zeros of the binary signals provided by said encoding means.

7. A remote control system for transmitting and receiving binary coded messages containing signal information including at least one remote control instruction and encoded clock signals comprising:
    means for generating at least one plural bit binary remote control instruction;
    a source of clock signals;
    means for serially encoding each of said bits of said binary instruction in consonance with signals from said clock signal source to produce a serially encoded data signal having a first continuous level for successive data bits of one value and a second continuous level for successive data bits of a second value, transitions between said first and second continuous levels occurring at a rate equal to or less than the rate of said clock signals;
    means for rearranging the format of said serially encoded signal to include level transitions within said continuous level portions in timed sequence with said clock signal;
    means for transmitting said rearranged signal;
    means receptive to transmitted signals for receiving said rearranged signal;
    decoding means for separating said binary instructions and said clock signals from said rearranged signal; and
    control means responsive to said binary instructions for actuating desired remote control functions.

8. Apparatus according to claim 7 wherein said rearranging means comprises:

a flip-flop receptive to said serially encoded instructions and said clock signals; and
an exclusive OR gate receptive to signals from said flip-flop and said source of clock signals for providing signals having an encoded clock and remote control instruction.

9. Apparatus according to claim 8 wherein said decoding means comprises:
means for generating impulses in response to logic level transitions of applied signals;
first pulse generating means coupled to said impulse generating means for generating pulses having a duration of more than one-half the interval of said clock signals and less than one clock signal interval;
second pulse generating means coupled to said first generating means for providing pulses having a duration substantially equal to one-half of said clock signal interval;
a flip-flop having a data input receptive to signals from said receiving means and a clock input receptive to signals from said first pulse generating means; and
means for combining signals from said flip-flop and said second pulse generating means to reproduce said serial encoded signal.

10. Apparatus according to claim 9 wherein said first and second pulse generating means are monostable multivibrators.

11. Apparatus according to claim 9 wherein said means for generating impulses comprises:
a first exclusive OR gate receptive to applied input signals; and
a second exclusive OR gate receptive to said input signals and signals provided by said first exclusive OR gate.

* * * * *

Disclaimer 3,987,414.—*Alois Vaclav Tuma*, Schlieren, Switzerland. DIGITAL REMOTE CONTROL FOR ELECTRONIC SIGNAL RECEIVERS. Patent dated Oct. 19, 1976. Disclaimer filed Mar. 27, 1981, by the assignee, *RCA Corp.*

*Hereby enters this disclaimer to claims 1, 2, 3, 4 and 6 of said patent.*
[*Official Gazette May 19, 1981.*]